(12) United States Patent
Chou et al.

(10) Patent No.: US 7,956,666 B2
(45) Date of Patent: Jun. 7, 2011

(54) MIXER CAPABLE OF IMPROVING SIGNAL QUALITY

(75) Inventors: Chung-Yun Chou, Hsinchu Hsien (TW); Chao-Tung Yang, Hsinchu Hsien (TW)

(73) Assignee: MStar Semiconductor, Inc., Hsinchu Hsien (TW)

( * ) Notice: Subject to any disclaimer, the term of this patent is extended or adjusted under 35 U.S.C. 154(b) by 0 days.

(21) Appl. No.: 12/605,440

(22) Filed: Oct. 26, 2009

(65) Prior Publication Data

US 2010/0219875 A1    Sep. 2, 2010

(30) Foreign Application Priority Data

Feb. 27, 2009  (TW) ................................ 98106350 A

(51) Int. Cl.
*G06G 7/12* (2006.01)
(52) U.S. Cl. ...................... 327/355; 455/326; 327/357
(58) Field of Classification Search .......... 327/355–361; 455/326, 323
See application file for complete search history.

(56) References Cited

U.S. PATENT DOCUMENTS

| | | | | |
|---|---|---|---|---|
| 7,457,606 B2 * | 11/2008 | Kim | .............................. | 455/323 |
| 7,477,888 B2 * | 1/2009 | Behzad | ......................... | 455/323 |
| 7,514,981 B2 * | 4/2009 | Yang et al. | ..................... | 327/359 |
| 7,529,529 B2 * | 5/2009 | Taylor | ............................ | 455/130 |
| 7,554,381 B2 * | 6/2009 | Belot et al. | ..................... | 327/359 |

* cited by examiner

*Primary Examiner* — Dinh T. Le
(74) *Attorney, Agent, or Firm* — WPAT, PC; Justin King

(57) ABSTRACT

A mixer includes a transduction circuit, a first and a second switch circuit, and a first and a second load circuit. The transconductor circuit is for generating a differential current signal according to a differential voltage signal. The first switch circuit and the first load circuit are connected in series, and the first switch circuit is used to regulate the differential current signal in response to a first oscillator signal. The second switch circuit and a second load circuit are connected in series, and the second switch circuit is used to regulate the differential current signal in response to a second oscillator signal. The first load circuit and the second load circuit are connected at a common node to reduce harmonic interferences.

9 Claims, 7 Drawing Sheets

US 7,956,666 B2

MIXER CAPABLE OF IMPROVING SIGNAL QUALITY

CROSS REFERENCE TO RELATED PATENT APPLICATION

This patent application is based on Taiwan, R.O.C. patent application No. 98106350 filed on Feb. 27, 2009.

FIELD OF THE INVENTION

The present invention relates to a mixer, and more particularly, to a mixer capable of improving signal quality.

BACKGROUND OF THE INVENTION

In a wireless transmitter or a wireless receiver, a mixer is widely used as a frequency conversion device. FIG. 1 shows a conventional wireless transmitter 10 capable of converting a base-band transmitting signal to a radio frequency (RF) transmitting signal to be transmitted via an antenna. The wireless transmitter 10 comprises filters 11 and 12, programmable gain amplifiers 13 and 14, mixers 15 and 16, and a power amplifier 17. After removing needless frequency components from a base-band transmitting signal I by the filter 11, the base-band transmitting signal I is amplified by the programmable gain amplifier 13 and then sent to the mixer 15, where the base-band transmitting signal I is converted to an RF I signal according to a local oscillator signal $LO_I$ generated by a local oscillator (not shown). A base-band transmitting signal Q is similarly converted to an RF Q signal, which is sent to the power amplifier 17 together with the RF I signal, so as to amplify the RF I and Q signals for wireless transmission.

FIG. 2 is a conventional wireless receiver 20 capable of converting an RF receiving signal to a base-band receiving signal for subsequent signal processes. The wireless receiver 20 comprises a low noise amplifier 21, mixers 22 and 23, filters 24 and 25, and programmable gain amplifiers 26 and 27. After being amplified by the low noise amplifier 21, frequencies of in-phase and quadrature-phase signals of the RF receiving signal are converted into base-band frequencies respectively by the mixers 22 and 23 according to local oscillator signals $LO_I$ and $LO_Q$ generated by a local oscillator (not shown). After removing needless frequency components by the filters 24 and 25 and amplifying by the programmable gain amplifiers 26 and 27, base-band receiving signals I and Q are generated. Hence, signal quality of the wireless communication depends largely on the frequency conversion of the mixer 15 and 16, 22 and 23.

FIG. 3 is a circuit diagram of a conventional mixer. Referring to FIG. 3, a Gilbert mixer 30 comprises a transconductor circuit 31, a switch circuit 32 and a load circuit 33 having loads 331 and 332. Each of the loads 331 and 332 has its one end coupled to a voltage source Vcc and its other end serving as an output end. The switch circuit 32 comprises n-channel transistors M3, M4, M5 and M6. The transistors M3 and M5 have their drains coupled to one end of the load 331, and the transistors M4 and M6 have their drains coupled to one end of the load 332. Moreover, the transistor M3 and the transistor M6 have their gates coupled to each other, the transistor M4 and the transistor M5 have their gates coupled to each other. The gates of the transistors M3 and M4 are capable of receiving a local oscillator signal LO. The transistor M3 and the transistor M4 are coupled to each other to form a first current path, and the transistor M5 and the transistor M6 are coupled to each other to form a second current path.

The transconductor circuit 31 comprises n-channel transistors M1 and M2. The transistor M1 has its drain coupled to the first current path of the switch circuit 32, and the transistor M2 has its drain coupled to the second current path of the switch circuit 32. Gates of the transistors M1 and M2 respectively receive differential voltage signals $Vin^+$ and $Vin^-$. The sources of the transistors M1 and M2 are coupled to each other. Moreover, an n-channel transistor MS is coupled between the source of the transistor M1 and a ground terminal; and a fixed voltage is inputted into a gate of the n-channel transistor MS such that the n-channel transistor MS forms a current source.

FIG. 4 is a schematic diagram of signals associated with the Gilbert mixer 30. The transconductor circuit 31 converts input differential voltage signals such as the $Vin^+$ and $Vin^-$ to a current signal Ib. When flowing through the first current path and the second current path of the switch circuit 32, the current signal Ib, being driving by an oscillator signal LO, becomes a frequency-converted current signal, e.g., the current signal Ib is converted from a base-band frequency to a radio frequency as illustrated in FIG. 4. After that, the frequency-converted current signal is converted by the load circuit 33 so that an output voltage is generated at the output end.

However, transistors of a conventional mixer are not completely ideal. For example, the transistors have nonlinear characteristics, due to which harmonic interferences are generated at an output voltage of the mixer, and thus signal quality of a frequency conversion is reduced.

In addition, in the conventional mixer, bias points of a transconductor circuit and a switch circuit are correlative rather than being independent so that linearity of the transconductor circuit is influenced. For example, in the Gilbert mixer 30 illustrated in FIG. 3, correlation exists between bias points of the transconductor circuit 31 and the switch circuit 32. When the bias point of the switch circuit 32 is too low, the bias point of the transconductor circuit 31 becomes too low such that the transistors M1 and M2 can not operate in a saturation region and the linearity of the transconductor circuit 31 is swayed. When the bias point of the transconductor circuit 31 or the switch circuit 32 is shifted higher in order to avoid the foregoing problem, the switch circuit 32 may not operate normally.

SUMMARY OF THE INVENTION

In view of the foregoing issues, one object of the present invention is to provide a mixer capable of reducing harmonic interferences to improve signal quality during a frequency conversion performed by the mixer.

Another object of the present invention is to provide a mixer capable of independently biasing a transconductor circuit and a switch circuit inside the mixer to ensure linearity of the transconductor circuit, so as to improve signal quality during a frequency conversion performed by the mixer.

A mixer is provided according to the present invention. The mixer comprises a transconductor circuit, a first switch circuit, a first load circuit, a second switch circuit and a second load circuit. The transconductor circuit is for generating a differential current signal according to a differential voltage signal. The first switch circuit and the first load circuit are connected in series, and the first switch circuit is used to regulate the differential current signal in response to a first oscillator signal. The second switch circuit and a second load circuit are connected in series, and the second switch circuit is used to regulate the differential current signal in response to a second oscillator signal. The first load circuit and the second load circuit are connected at a common node to reduce harmonic interferences.

A mixer is further provided according to the present invention. The mixer comprises a transconductor circuit, a switch circuit, and a load circuit. The transconductor circuit generates a differential current signal according to a differential voltage signal. The switch circuit and the load circuit are connected in series, and the switch circuit is used for regulating the differential current signal in response to an oscillating signal. The transconductor circuit and the switch circuit are biased independently.

In an embodiment, the foregoing mixer further comprises a capacitance unit coupled between the transconductor circuit and the switch circuit. The capacitance unit is for separating biases provided for transconductor circuit and the switch circuit.

DETAILED DESCRIPTION OF THE PREFERRED EMBODIMENT

Figure 5:
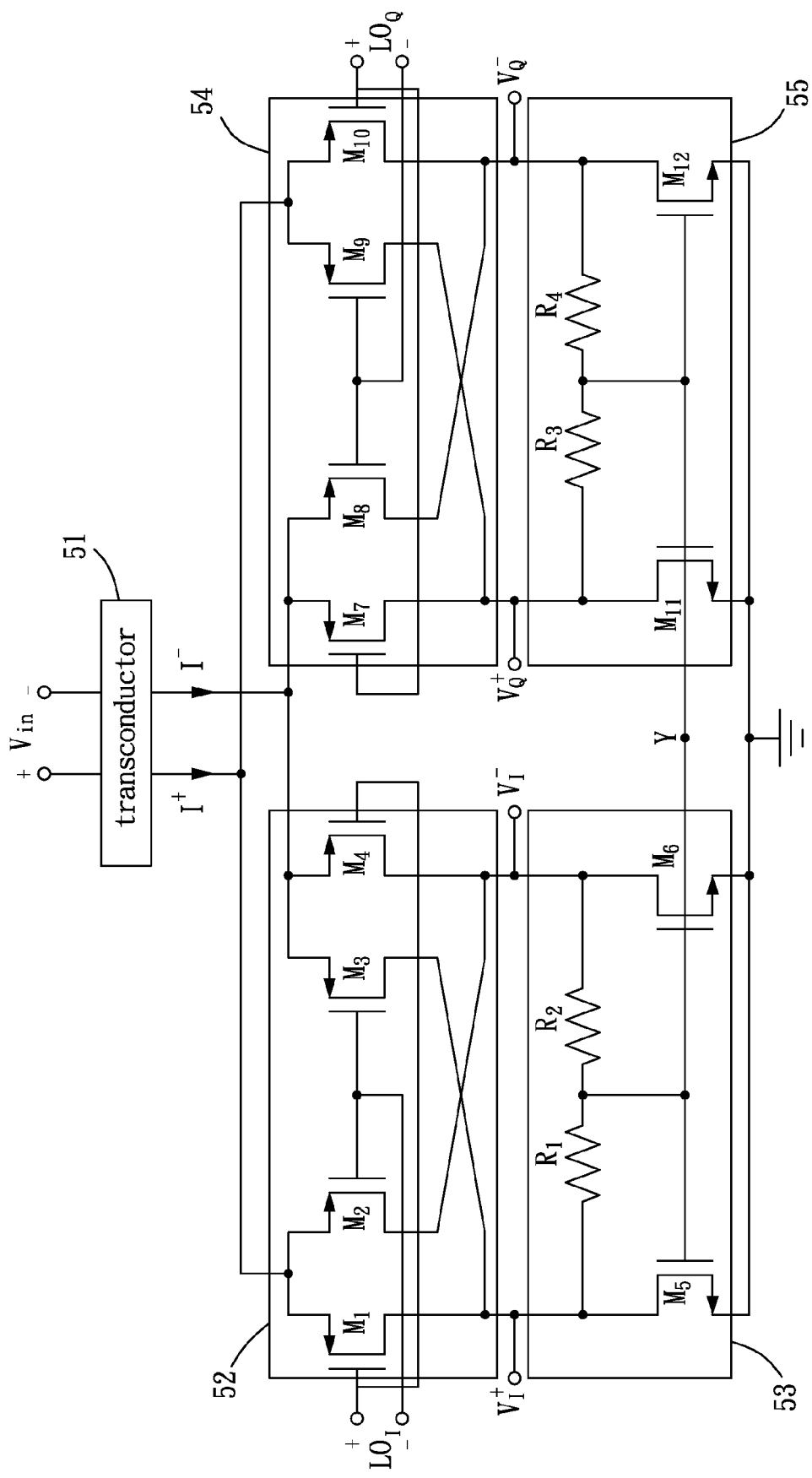
FIG. 5 is a circuit diagram of a mixer in accordance with a first embodiment of the present invention.

FIG. 5 is a circuit diagram of a mixer in accordance with a first embodiment of the present invention. A mixer 50 comprises a transconductor circuit 51, a first switch circuit 52, a first load circuit 53, a second switch circuit 54, and a second load circuit 55. The transconductor circuit 51 receives differential voltage signals $Vin^+$ and $Vin^-$ and correspondingly outputs differential current signals $I^+$ and $I^-$, which are respectively referred to as a first current signal and a second current signal in the following description. The first switch circuit 52 comprises four p-channel transistors M1, M2, M3 and M4. Whether to allow the passing of the first current signal is controlled by the transistors M1 and M2 according to a local oscillator $LO_I$, and whether to allow the passing of the second current signal is controlled by the transistors M3 and M4 according to the local oscillator signal $LO_I$. Accordingly, the first switch circuit 52 converts a frequency of the differential current signal into a summation of the frequency of the differential current signal and a frequency of the local oscillator signal $LO_I$. Similarly, the second switch circuit 54 comprises four p-channel transistors M7, M8, M9 and M10. Whether to allow the passing of the second current signal is controlled by the transistors M7 and M8 according to a local oscillator signal $LO_Q$, and whether to allow the passing of the first current signal is controlled by the transistors M9 and M10 according to the local oscillator signal $LO_Q$. Therefore, the second switch circuit 54 converts a frequency of the differential current signal to a summation of the frequency of the differential current signal and a frequency of the local oscillator signal $LO_Q$. It is to be noted that, a phase difference between the local oscillator signal $LO_I$ and the local oscillator signal $LO_Q$ is about 90 degrees.

The first load circuit 53 comprises n-channel transistors M5 and M6, and resistors R1 and R2. Gates of the transistors M5 and M6 are coupled to each other, and the transistor M5 has its drain coupled to drains of the transistors M1 and M3. The transistor M6 has its drain coupled to drains of the transistors M2 and M4. The coupling points between the transistors M5 and M6 and the first switch circuit 52 are first differential output ends of the mixer 50, and differential output voltages of which are represented by $V_I^+$ and $V_I^-$. The resistor R1 is coupled between the drain and the gate of the transistor M5, and resistor R2 is coupled between the drain and the gate of the transistor M6. Similarly, the second load circuit 55 comprises n-channel transistors M11 and M12, and resistors R3 and R4. Gates of the transistors M11 and M12 are coupled to each other, and the transistor M11 has its drain coupled to drains of the transistors M7 and M9. The transistor M12 has its drain coupled to drains of the transistors M8 and M10. The coupling points are second differential output ends of the mixer 50, and differential output voltages of which are represented by $V_Q^+$ and $V_Q^-$. The resistor R3 is coupled between the gate and the drain of the transistor M11, and the resistor R4 is coupled between the gate and the drain of the transistor M12.

In the first load circuit 53, a direct current signal (being a bias signal) only flows through the transistor M5 but not the resistor R1. Therefore, the output voltages $V_I^+$ and $V_I^-$ comprising direct and alternating current components only need to respectively activate the transistors M5 and M6 to operate in a saturation region. That is, the output voltages $V_I^+$ and $V_I^-$ need not to be too large so that operating voltages of the first switch circuit 52 and the transconductor circuit 51 shall not be out of an appropriate range, thus keeping the mixer 50 uninfluenced. Further, since only an alternating current signal (being a data signal carried in the bias signal) flows through the resistors R1 and R2, which are then given larger resistance values for generating a larger gain value for the alternating current signal. Similarly, in the second load circuit 55, the resistors R3 and R4 also can have larger resistance values for generating a larger gain value for the alternating current signal. Consequently, the first load circuit 53 and the second load circuit 55 are capable of providing larger signal gain values without causing too much voltage drop.

It is to be noted that, referring to FIG. 5, the gates of the transistors M5, M6, M11 and M12 are mutually coupled to reduce harmonic interferences. The reason is analyzed below.

Suppose that alternating current components of the output voltages $V_I^+$, $V_I^-$, $V_Q^+$ and $V_Q^-$ are cos ωt, −cos ωt, cos(ωt+90°) and cos(ωt+90°), respectively, wherein ω is the frequency of the local oscillator signals $LO_I$ and $LO_Q$. For that the transistors M5, M6, M11 and M12 have a non-linearity, the foregoing output voltages generate harmonic components between the gates of the transistors. The output voltages $V_I^+$, $V_I^-$, $V_Q^+$ and $V_Q^-$ are expanded based on Fourier series, such as:

$V_I^+ \rightarrow a1 \cos \omega t + a2 \cos 2\omega t + a3 \cos 3\omega t + $ $V_I^- \rightarrow a1 \cos \omega t + a2 \cos 2\omega t - a3 \cos 3\omega t + $ $V_Q^+ \rightarrow a1 \cos(\omega t+90°) + a2 \cos(2\omega t+180°) + a3 \cos(3\omega t+270°) + \ldots$ $V_Q^- \rightarrow a1 \cos(\omega t+90°) + a2 \cos(2\omega t+180°) - a3 \cos(3\omega t+270°) + \ldots$ where a1, a2, a3 and so on are weighting coefficients of the harmonic components. The presence of the harmonic components imposes severe interference on the gate-source voltages ($V_{GS}$) between the transistors M5, M6, M11 and M12. Hence, the output voltages $V_I^+$, $V_I^-$, $V_Q^+$ and $V_Q^-$ are undesirably affected and signal quality of the mixer 50 is also deteriorated. Therefore, in FIG. 5, the gates of the transistors M5, M6, M11 and M12 are mutually coupled, and a voltage at a Y point is:

$$\begin{aligned}V_Y &= [a1\cos\omega t + a2\cos 2\omega t + a3\cos 3\omega t + \ldots ] + \\ &\quad [-a1\cos\omega t + a2\cos 2\omega t - a3\cos 3\omega t + \ldots ] + \\ &\quad [a1\cos(\omega t + 90^0) + a2\cos(2\omega t + 180^0) + a3\cos(3\omega t + 270^0) + \ldots ] + \\ &\quad [-a1\cos(\omega t + 90^0) + a2\cos(2\omega t + 180^0) - a3\cos(3\omega t + 270^0) + \ldots ] \\ &= 2a2\cos 2\omega t + 2a2\cos(2\omega t + 180^0) + 2a4\cos 4\omega t + \\ &\quad 2a4\cos(4\omega t + 360^0) + 2a6\cos 6\omega t + 2a6\cos(6\omega t + 540^0) + \ldots \\ &= 4a4\cos 4\omega t + 4a8\cos 8\omega t + \ldots\end{aligned}$$

wherein odd-numbered harmonic components cancel out one another, and even-numbered harmonic components such as two-order or six-order harmonic components also cancel out one another, so that even-numbered harmonic components such as four-order, eight-order harmonic components are remained. Since the harmonic components remained behind are not too large, the gate-source voltages $V_{GS}$ of the transistors M5, M6, M11 and M12 are only influenced by a small amount of harmonic interferences such that the output voltages $V_I^+$, $V_I^-$, $V_Q^+$ and $V_Q^-$ are kept stable while also increasing the signal quality of the mixer 50.

Figure 6:
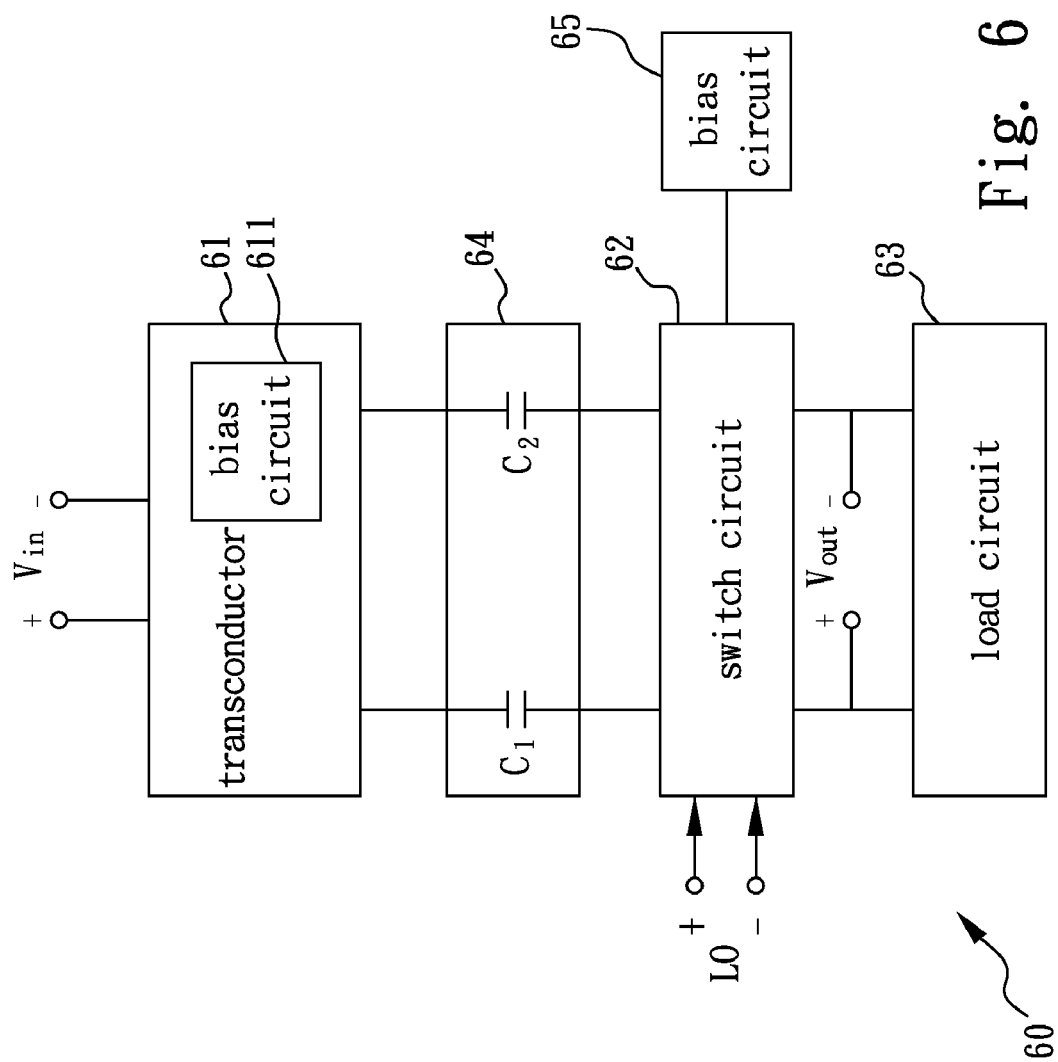
FIG. 6 is a circuit diagram of a mixer in accordance with a second embodiment of the present invention.'

FIG. 6 is a circuit diagram of a mixer in accordance with a second embodiment of the present invention. A mixer 60 comprises a transconductor circuit 61, a switch circuit 62, a load circuit 63, a capacitance unit 64 and a bias circuit 65. The transconductor circuit 61 comprises a bias circuit 611, and the capacitance unit 64 comprises capacitors C1 and C2. The mixer 60 performs a frequency conversion of an input voltage Vin according a local oscillator signal LO to generate an output voltage Vout. The main characteristic of the mixer 60 is that the transconductor circuit 61 and the switch circuit 62 have their own bias circuits to bias independently. That is, the transconductor circuit 61 and the switch circuit 62 respectively decide bias points as needed, so that an issue of swaying the linearity of the transconductor circuit in the prior art, due to the non-independent bias points of the transconductor circuit and the switch circuit, is eliminated. In addition, the capacitors C1 and C2 of the capacitance unit 64 are coupled between the transconductor circuit 61 and the switch circuit 62, thus prohibiting the communication between the transconductor 61 and the switch circuit 62 to further ensure that bias provided by the bias circuits 611 and 65 are independent from each other. In another embodiment, the bias circuit 611 is designed as being outside the transconductor circuit 61. The bias circuits 611 and 65 can be current sources or voltage supplies.

Figure 7:
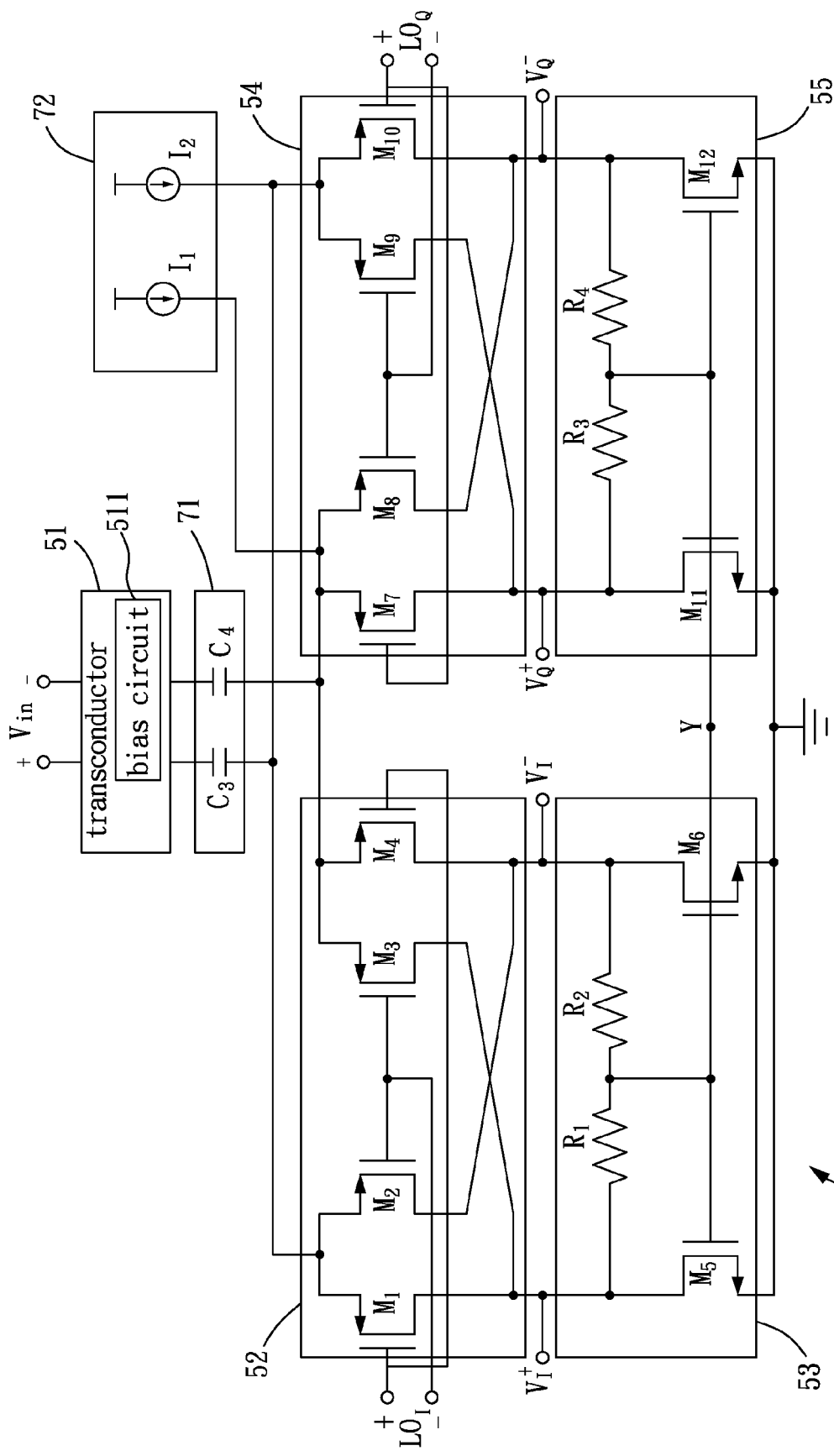
FIG. 7 is a circuit diagram of a mixer in accordance with a third embodiment of the present invention.

FIG. 7 is a circuit diagram of a mixer in accordance with a third embodiment of the present invention. The main characteristic of the second embodiment is applied to the first embodiment. Compared with the mixer 50 of the first embodiment, a mixer 70 of the third embodiment further comprises bias circuits 511 and 72, and a capacitance unit 71. The bias circuit 511 provides a bias to the transconductor circuit 51. The bias circuit 72 comprises current sources I1 and I2 for providing biases to the first switch circuit 52 and the second switch circuit 54. The current source I1 is coupled to the transistors M3, M4, M7, and M8, and the current source I2 is coupled to the transistors M1, M2, M9, and M10. The transconductor circuit 51 comprises two current output ends for outputting differential current signals. The capacitance unit 71 comprises capacitors C3 and C4. The capacitor C3 has its one end coupled to one current output end of the transconductor circuit 51, and its other end coupled to the transistors M1, M2, M9, and M10. The capacitor C4 has its one end coupled to the other current output end of the transconductor 51, and its other end coupled to the transistors M3, M4, M7, and M8. The capacitance unit 71 allows the biases provided by the bias circuits 511 and 72 to be independent from each other.

Figure 1:
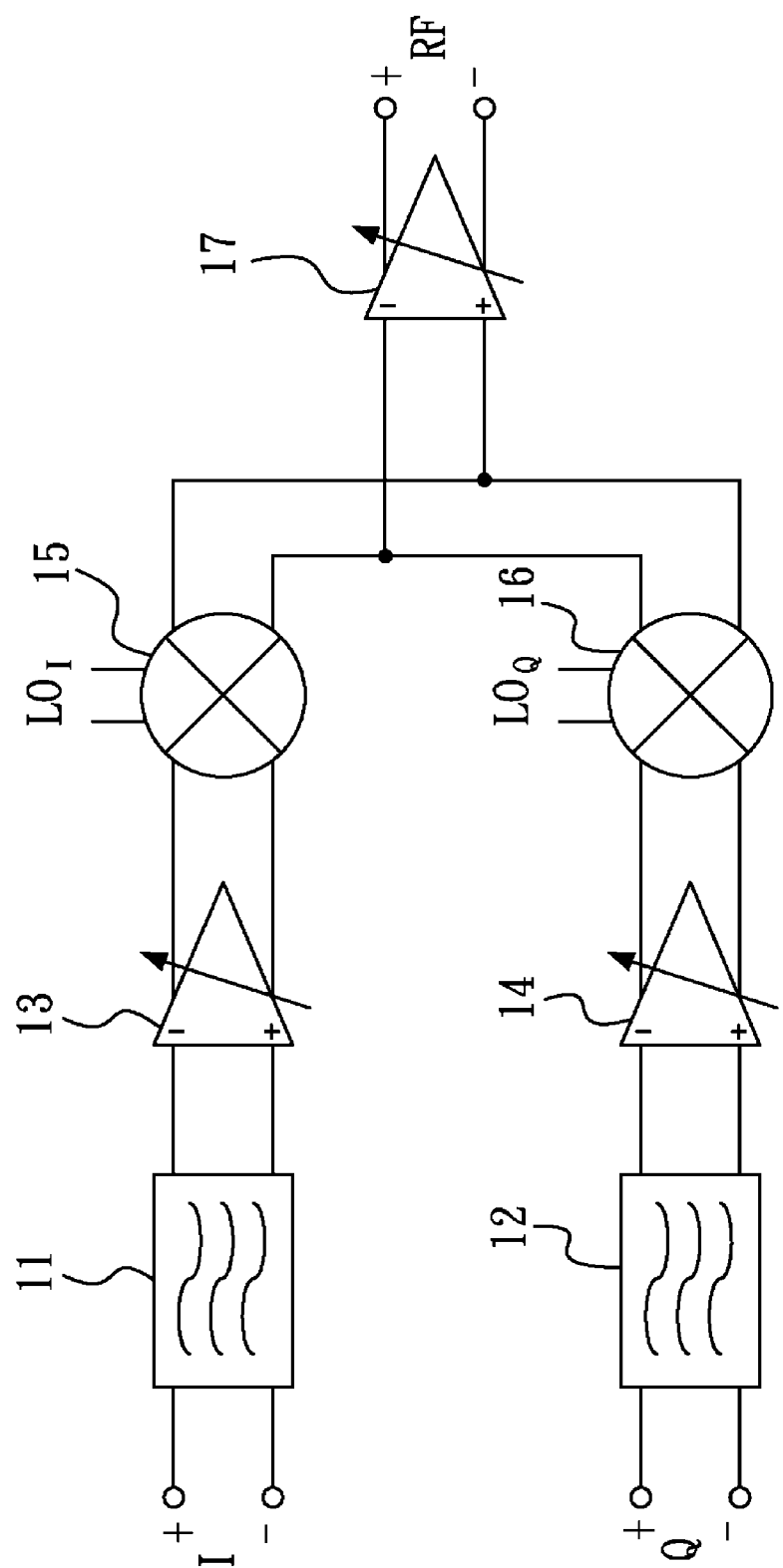
FIG. 1 is a schematic diagram of a conventional wireless transmitter.
Figure 2:
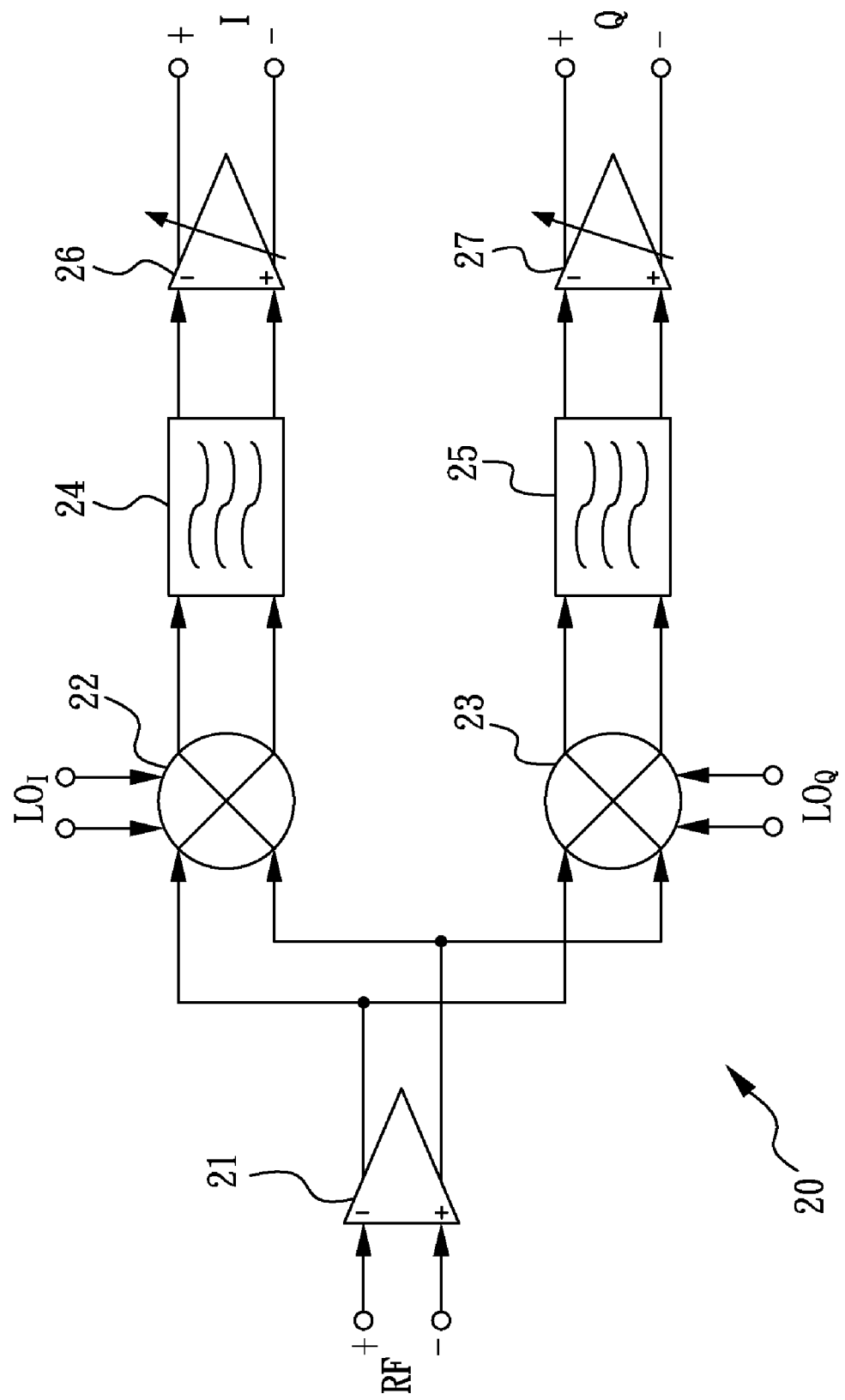
FIG. 2 is a schematic diagram of a conventional wireless receiver.
Figure 3:
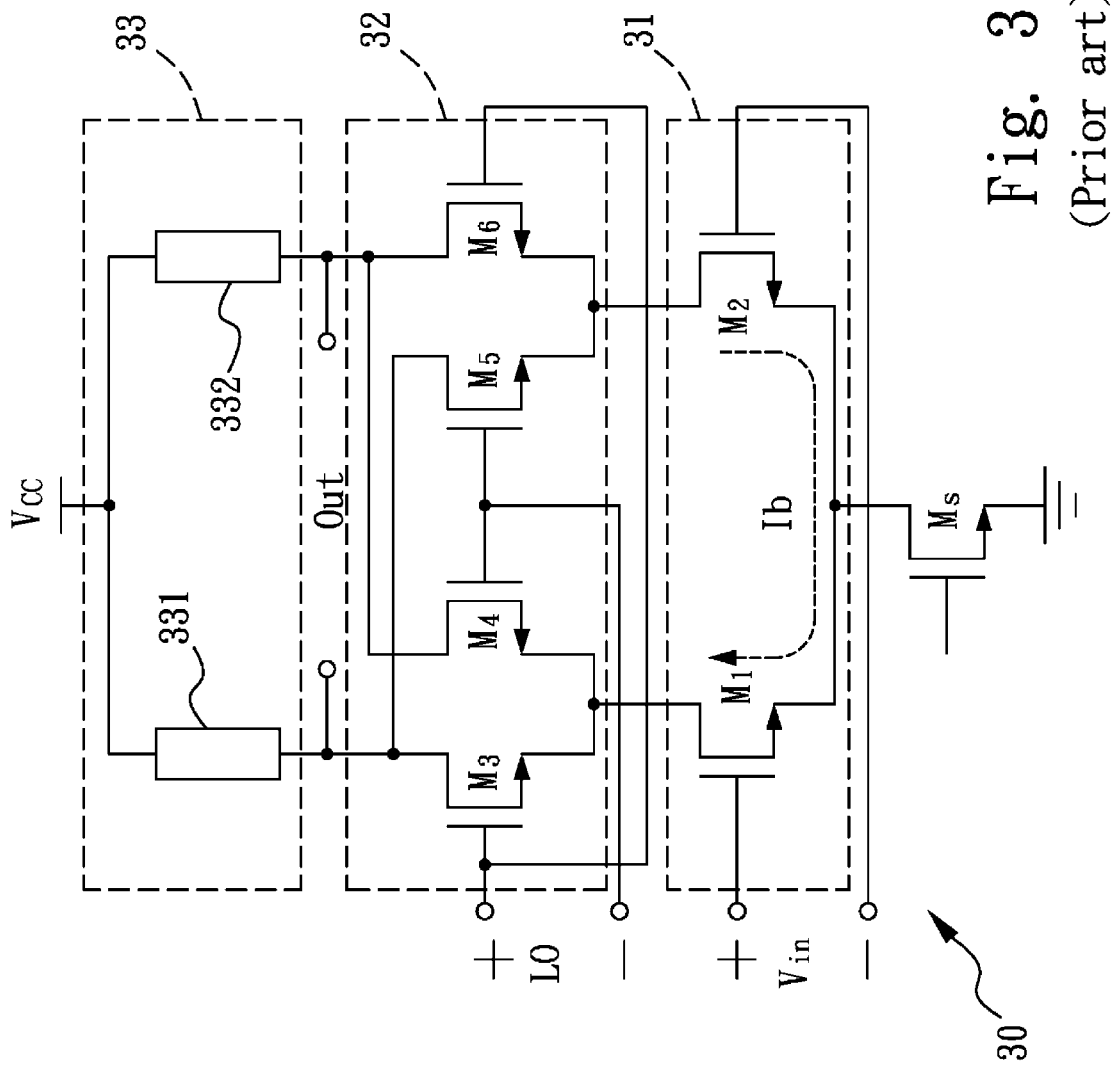
FIG. 3 is a circuit diagram of a conventional mixer.
Figure 4:
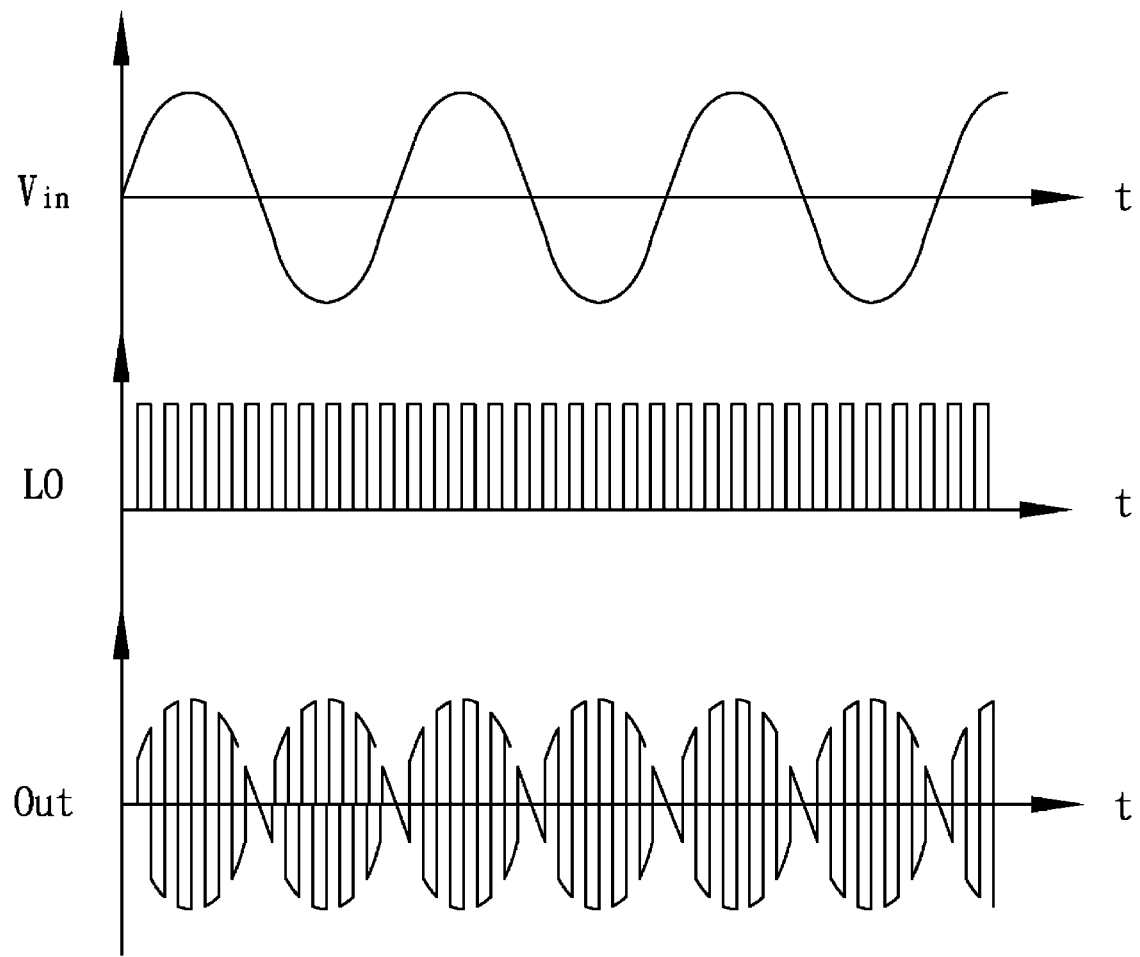
FIG. 4 is a schematic diagram of signals associated with a conventional mixer.

In a practical application, the mixers 50 and 70 respectively illustrated in FIGS. 5 and 7 are applied to the wireless transmitters 10 and 20 to replace the mixers respectively illustrated in FIGS. 1 and 2, so as to achieve the object of improving the signal quality.

While the invention has been described in terms of what is presently considered to be the most practical and preferred embodiments, it is to be understood that the invention needs not to be limited to the above embodiments. On the contrary, it is intended to cover various modifications and similar arrangements included within the spirit and scope of the appended claims which are to be accorded with the broadest interpretation so as to encompass all such modifications and similar structures.

What is claimed is:

1. A mixer, comprising:
   a transconductor circuit, receiving a differential voltage signal to generate and to output a differential current signal;
   a first switch circuit coupled to the transconductor circuit to regulate the differential current signal in response to a first oscillator signal;
   a first load circuit coupled to the first switch circuit, comprising:
      a first transistor and a second transistor, wherein drains of the first and second transistors are coupled to the first switch circuit to form a first differential output end;
      a first resistor coupled between a gate and the drain of the first transistor; and
      a second resistor coupled between a gate and the drain of the second transistor;
   a second switch circuit coupled to the transconductor circuit to regulate the differential current signal in response to a second oscillator signal; and
   a second load circuit coupled to said second switch, comprising:
      a third transistor and a fourth transistor, wherein drains of the third and fourth transistors are coupled to the second switch circuit to form a second differential output end;
      a third resistor coupled between a gate and the drain of the third transistor; and
      a fourth resistor coupled between a gate and the drain of the fourth resistor;
   wherein the first load circuit and the second load circuit are connected at a common node;
   wherein the gates of the first transistor, the second transistor, the third transistor, and the fourth transistor are connected to form the common node.

2. The mixer as claimed in claim 1, wherein the differential current signal comprises:
   a first current signal; and
   a second current signal; and the first switch circuit comprises a first switch, a second switch, a third switch and a fourth switch; the first and second switches are for controlling whether to be passed by the first current signal, and the third and fourth switches are used for controlling whether to be passed by the second current signal.

3. The mixer as claimed in claim 2, wherein the drain of the first transistor is coupled to the first switch and the third switch, and the drain of the second transistor is coupled to the second switch and the fourth switch.

4. The mixer as claimed in claim 2, wherein the second switch circuit further comprises a fifth switch, a sixth switch, a seventh switch and an eighth switch, the fifth and sixth switches are for controlling whether to be passed by the second current signal, and the seventh and eighth switches are for controlling whether to be passed by the first current signal.

5. The mixer as claimed in claim 4, wherein the drain of the third transistor is coupled to the fifth switch and the seventh switch, and the drain of the fourth transistor is coupled to the sixth switch and the eighth switch.

6. The mixer as claimed in claim 1, wherein the first load circuit and the second load circuit are connected at the common node for reducing harmonic interferences.

7. The mixer as claimed in claim 1, wherein a phase difference between the first oscillator signal and the second oscillator signal is 90 degrees.

8. The mixer as claimed in claim 1, further comprising:
a first bias circuit for providing a first bias to the transconductor circuit; and
a second bias circuit for providing a second bias to the first and second switch circuits.

9. The mixer as claimed in claim 8, further comprising:
a capacitance unit, coupled between the transconductor circuit, the first switch circuit, and the second switch circuit;
wherein the capacitance unit is for making the first bias and the second bias independent from each other.

* * * * *